(12) United States Patent
Jang et al.

(10) Patent No.: US 9,645,639 B2
(45) Date of Patent: May 9, 2017

(54) APPARATUS AND METHOD FOR DRIVING TOUCH SENSOR

(71) Applicant: LG Display Co., Ltd., Seoul (KR)

(72) Inventors: Hyun-Woo Jang, Seoul (KR); Shi-Cheol Song, Gyeonggi-do (KR); Eun-Jung Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 1188 days.

(21) Appl. No.: 13/675,154

(22) Filed: Nov. 13, 2012

(65) Prior Publication Data

US 2013/0124140 A1     May 16, 2013

(30) Foreign Application Priority Data

Nov. 15, 2011   (KR) .................. 10-2011-0119213

(51) Int. Cl.
| | |
|---|---|
| *G01B 7/004* | (2006.01) |
| *G06F 3/01* | (2006.01) |
| *G06F 3/041* | (2006.01) |
| *G06F 3/044* | (2006.01) |
| *G02F 1/1333* | (2006.01) |
| *G01R 31/28* | (2006.01) |

(52) U.S. Cl.
CPC .............. *G06F 3/011* (2013.01); *G06F 3/044* (2013.01); *G06F 3/0416* (2013.01); *G01R 31/2829* (2013.01); *G02F 1/13338* (2013.01)

(58) Field of Classification Search
USPC ......................................................... 702/150
See application file for complete search history.

(56) References Cited

U.S. PATENT DOCUMENTS 8,542,213 B2 *   9/2013   Doi ...................... G06F 3/044
                                                              345/174
9,140,922 B2 *   9/2015   Noguchi ............. G02F 1/13338
(Continued)

FOREIGN PATENT DOCUMENTS

| CN | 1979404 A | 6/2007 |
| CN | 101526872 A | 9/2009 |

(Continued)

OTHER PUBLICATIONS

Office Action issued in counterpart Chinese Patent Application No. 201210459313.4 dated May 6, 2015.
(Continued)

*Primary Examiner* — Paul D Lee
(74) *Attorney, Agent, or Firm* — Morgan, Lewis & Bockius LLP

(57) ABSTRACT

Disclosed herein is an apparatus and method for driving a touch sensor, which is capable of improving touch sensitivity and accuracy. The touch sensor driving apparatus includes a touch sensor; a read-out circuit; and a signal processor configured to compare raw data from the read-out circuit with a predetermined primary reference value and secondary reference value so as to determine whether the touch node has been touched, wherein the signal processor collects the raw data of each touch node or each channel during a plurality of frames and resets and updates the secondary reference value of each touch node or each channel using the collected raw data.

18 Claims, 6 Drawing Sheets

(56) References Cited

U.S. PATENT DOCUMENTS

| | | | | |
|---|---|---|---|---|
| 2004/0001048 A1* | 1/2004 | Kraus | ............... | G06F 3/0421 |
| | | | | 345/173 |
| 2010/0053091 A1 | 3/2010 | Lee et al. | | |
| 2010/0097345 A1* | 4/2010 | Jang | ............... | G06F 3/0416 |
| | | | | 345/174 |
| 2010/0258361 A1* | 10/2010 | Yamauchi | ............ | H03K 17/962 |
| | | | | 178/18.06 |
| 2011/0050617 A1* | 3/2011 | Murphy | ............... | G06F 3/0418 |
| | | | | 345/174 |
| 2011/0050620 A1* | 3/2011 | Hristov | ............... | G06F 3/0416 |
| | | | | 345/174 |
| 2011/0116105 A1 | 5/2011 | Zhu et al. | | |
| 2011/0122096 A1* | 5/2011 | Kim | ............... | G06F 3/0412 |
| | | | | 345/175 |
| 2011/0148820 A1* | 6/2011 | Song | ............... | G06F 3/0428 |
| | | | | 345/175 |
| 2011/0266074 A1* | 11/2011 | Fan | ............... | G06F 3/0428 |
| | | | | 178/18.09 |
| 2012/0092296 A1* | 4/2012 | Yanase | ............... | G06F 3/0416 |
| | | | | 345/174 |

FOREIGN PATENT DOCUMENTS

| | | |
|---|---|---|
| CN | 102073418 A | 5/2011 |
| JP | 2011-210038 A | 10/2011 |

OTHER PUBLICATIONS

Office Action issued in counterpart Korean Patent Application No. 10-2011-0119213 dated Apr. 9, 2014.

\* cited by examiner

APPARATUS AND METHOD FOR DRIVING TOUCH SENSOR

This application claims the benefit of Korean Patent Application No. 10-2011-0119213, filed on Nov. 15, 2011, which is hereby incorporated by reference as if fully set forth herein.

BACKGROUND OF THE INVENTION

Field of the Invention

The present invention relates to an apparatus and method for driving a touch sensor, and more particularly, to an apparatus and method for driving a touch sensor, which is capable of improving touch sensitivity and accuracy by adaptively setting a secondary reference value of each touch node and determining presence/absence of a touch operation.

Discussion of the Related Art

Today, touch sensors capable of inputting information through touch on screens of various display apparatuses have been widely used as an information input apparatus of a computer system. Since a touch sensor moves or selects display information by touching a screen using a finger or a stylus, all people may easily utilize the touch sensor.

An apparatus for driving a touch sensor detects touch generated in the touch sensor on a display apparatus and a touch position and outputs touch information and a computer system analyzes the touch information and executes a command. As a display apparatus, a liquid crystal display apparatus, a flat display apparatus such as a plasma display panel, an organic light emitting diode display apparatus, etc. is mainly used. As touch sensor technology, a resistive method, a capacitive method, an optical method, an infrared method, an ultrasonic method, an electromagnetic method, etc. may be used according to sensing principles.

The touch sensor is manufactured in the form of a panel and is composed of an on-cell touch sensor attached to an upper portion of a display apparatus or an in-cell touch sensor mounted in a pixel matrix of a display apparatus. As a touch sensor, a photo touch sensor for detecting touch according to optical power using a photo transistor and a capacitive touch sensor for detecting touch according to capacitive change are mainly used.

In general, in an apparatus for driving a touch sensor, a read-out integrated circuit (IC) drives a touch sensor and detects raw data using a read-out signal received from the touch sensor. A micro control unit (MCU), which is a signal processor, compares the raw data with a reference signal, determines presence/absence of a touch operation, calculates touch coordinates, and transmits the touch coordinates to a host computer. The host computer executes a command corresponding to the touch coordinates.

In a display apparatus having a touch sensor, a noise component generated in the display apparatus is introduced into the touch sensor to be included in a read-out signal of the touch sensor. Although a noise filter for reducing a noise component is used, a noise component remains in raw data. Since the noise component of the display apparatus is changed according to images, raw data detected from a read-out signal of a touch node is also changed according to frames. In addition, raw data of each touch node may be changed according to external environmental conditions of a touch sensor and positions of a touch node.

However, since a conventional MCU compares raw data of each touch node with the same predetermined reference value and determines presence/absence of a touch operation, if raw data is changed according to noise of a peripheral environment, a touch operation may not be detected. Thus, touch sensitivity and accuracy may be deteriorated.

SUMMARY OF THE INVENTION

Accordingly, the present invention is directed to an apparatus and method for driving a touch sensor that substantially obviate one or more problems due to limitations and disadvantages of the related art.

An object of the present invention is to provide an apparatus and method for driving a touch sensor, which is capable of improving touch sensitivity and accuracy by adaptively setting a secondary reference value of each touch node or each channel and determining whether a touch is made or not for each touch node.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a touch sensor driving apparatus includes a touch sensor; a read-out circuit configured to drive the touch sensor, detect raw data of each touch node using each read-out signal received from the touch sensor, and output the raw data; and a signal processor configured to compare the raw data from the read-out circuit with a predetermined primary reference value and secondary reference value so as to determine whether the touch node has been touched and calculate and output touch coordinates corresponding the touch node which has been touched, wherein the signal processor collect the raw data of each touch node or each channel during a plurality of frames and reset and update the secondary reference value of each touch node or each channel using the collected raw data.

The signal processor may include a touch determination unit configured to determine whether the touch node has been touched and reset the secondary reference value, a touch coordinate calculator configured to calculate the touch coordinates, and an interface configured to enable the output of the touch coordinates.

The touch determination unit may reset the secondary reference value if a power supply is turned on and/or if the touch sensor has not been touched during a predetermined period or more.

The touch determination unit may collect the raw data of each touch node or each channel during a plurality of frames which the touch sensor has not been touched, calculates an average value, a minimum value and a maximum value of each touch node or each channel using the collected raw data of each touch node or each channel, and resets the secondary reference value using at least one of a difference between the average value and the minimum value, a difference between the average value and the maximum value, and the minimum value of each touch node or each channel.

The secondary reference value is reset as the minimum of each touch node or each channel, or as a value obtained by subtracting the difference of each touch node or each channel from the primary reference value.

The touch determination unit may compare the raw data of each touch node with the primary reference value and determines that the corresponding touch node is touched if the raw data is equal to or greater than the primary reference value, compares the raw data of each touch node with the secondary reference value if the raw data is less than the primary reference value, determines that the corresponding touch node is touched if the raw data is equal to or greater than the secondary reference value, and determines that the corresponding touch node is not touched if the raw data is less than the secondary reference value.

The touch determination unit compares the raw data with a base value, which is less than the primary reference value, before comparing the raw data with the primary reference value, compares the raw data with the primary reference value only if the raw data is equal to or greater than the base value, and determine that the touch node is not touched if the raw data is less than the base value.

The touch determination unit may discard the reset secondary reference value and use a previously set secondary reference value, if the touch sensor is touched when resetting the secondary reference value.

In another aspect of the present invention, a method for driving a touch sensor includes detecting and outputting raw data of each touch node using each read-out signal received from the touch sensor while driving the touch sensor, determining whether a secondary reference value used to determine whether a touch node is touched is reset, collecting raw data of each touch node or each channel during a plurality of frames when resetting the secondary reference value and resetting the secondary reference value of each touch node using the collected raw data if it is determined that the secondary reference value is reset, comparing the raw data of each touch node with a predetermined primary reference value and determining whether the touch node is touched, if it is determined that the secondary reference value is not reset and after the secondary reference value is reset, comparing the raw data of each touch node with the secondary reference value and determining whether the touch node is touched if the raw data is less than the primary reference value, and calculating and outputting touch coordinates using determined raw data that the touch node is touched.

The determining whether the secondary reference value is reset includes determining that the secondary reference value is reset if a power supply is turned on and/or the touch sensor is not touched during a predetermined period or more to reset the secondary reference value and, otherwise, determining that the secondary reference value is not reset.

The resetting the secondary reference value may include collecting the raw data of each touch node or each channel during the plurality of frames which the touch sensor is not touched, calculating at least one of an average value, a minimum value and a maximum value of each touch node or each channel using the collected raw data of each touch node, and resetting the secondary reference value using at least one of a difference between the average value and the minimum value, a difference between the average value and the maximum value, and the minimum value of each touch node or each channel.

The comparing the raw data of each touch node with the primary reference value includes determining that the corresponding touch node is touched if the raw data is equal to or greater than the primary reference value.

The comparing the raw data of each touch node with the secondary reference value includes determining that the corresponding touch node is touched if the raw data is equal to or greater than the secondary reference value, and determining that the corresponding touch node is not touched if the raw data is less than the secondary reference value.

The method further comprises comparing the raw data with a base value, which is less than the primary reference value, before comparing the raw data with the primary reference value; proceeding the comparing the raw data with the primary reference value only if the raw data is equal to or greater than the base value; and determining that the touch node is not touched if the raw data is less than the base value. The reset secondary reference value may be discarded and a previously set secondary reference value is used, if the touch node is touched when resetting the secondary reference value.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Figure 1:
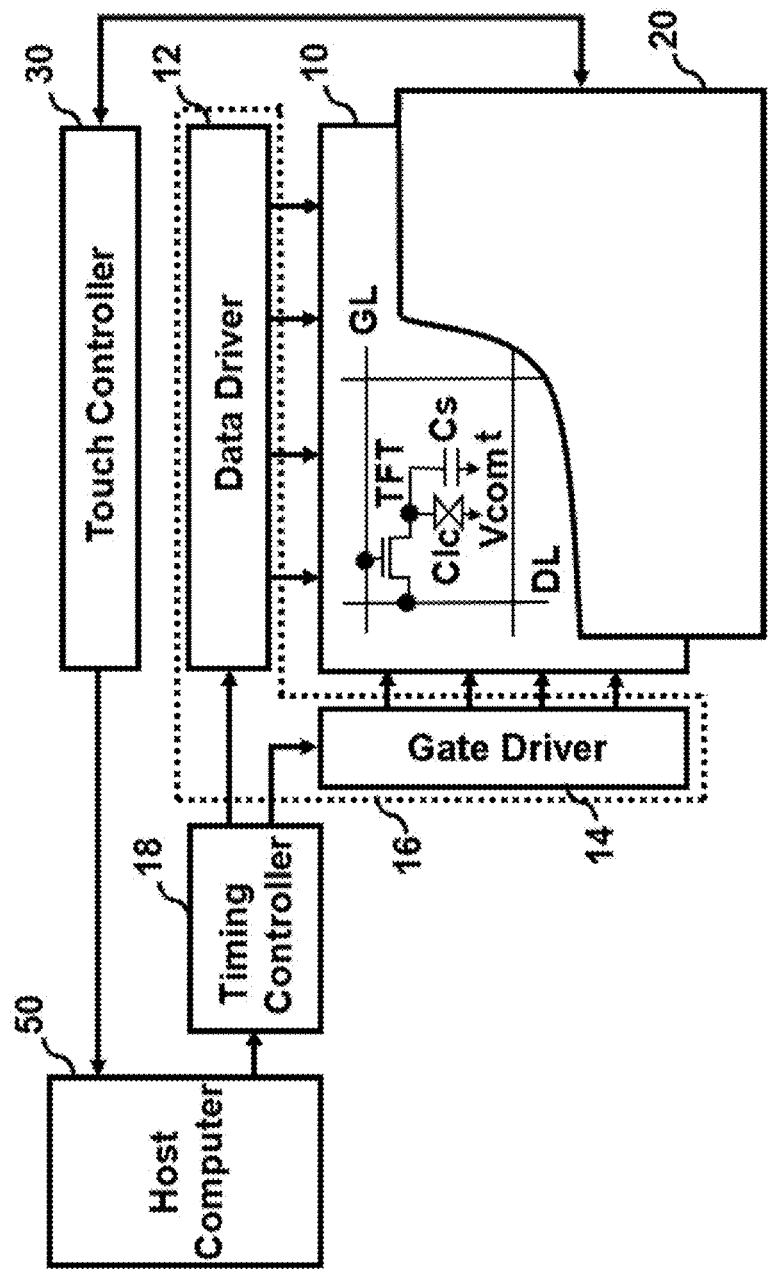
FIG. 1 is a block diagram showing the configuration of a display apparatus including a touch sensor driving apparatus according to an embodiment of the present invention.
Figure 2:
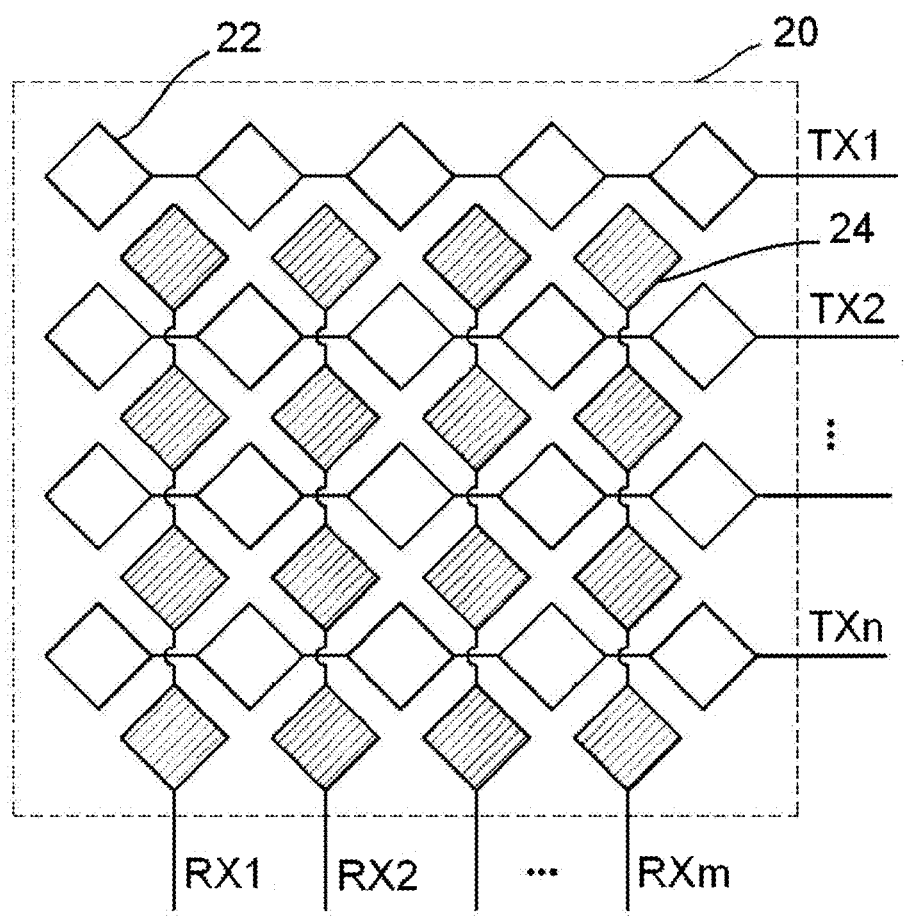
FIG. 2 is a diagram showing an example of the structure of the touch sensor shown in FIG. 1.

FIG. 1 is a block diagram showing the configuration of a display apparatus including a touch sensor driving apparatus according to an embodiment of the present invention, and FIG. 2 is a diagram showing an example of the structure of the touch sensor 20 shown in FIG. 1.

The display apparatus including the touch sensor driving apparatus shown in FIG. 1 includes a display panel 10, a panel drive unit 16 including a data driver 12 and gate driver 14 for driving the display panel 10, a timing controller 18 for controlling the panel drive unit 16, a touch sensor 20 on the display panel 10, and a touch controller 30 for driving the touch sensor 20. The timing controller 18 and the touch controller 30 are connected to a host computer 50.

The timing controller 18 and the data driver 12 are integrated into respective integrated circuits (ICs) or the timing controller 18 may be incorporated in the data driver 12 such that the timing controller 18 and the data driver 12 may be integrated into one IC. The touch controller 30 and the timing controller 18 are integrated into respective integrated circuits (ICs) or the touch controller 30 may be incorporated in the timing controller 18 such that the touch controller 30 and the timing controller 18 may be integrated into one IC.

The display panel 10 includes a pixel array in which a plurality of pixels is arranged. The pixel array displays graphic user interfaces (GUIs) including a pointer or a cursor and other images. The display panel 10 may be a flat display panel such as a liquid crystal display panel (hereinafter, a "liquid crystal panel"), a plasma display panel or an organic light emitting diode display panel. In the description herein, the display panel 10 is described as a liquid crystal panel. However, other types of display panels may be used in different embodiments.

If a liquid crystal panel is used as the display panel 10, the display panel 10 includes a color filter substrate on which a color filter array is formed, a thin-film transistor substrate on which a thin-film transistor array is formed, a liquid crystal layer located between the color filter substrate and the thin-film transistor substrate, and polarization plates attached to external surfaces of the color filter substrate and the thin-film transistor substrate. The display panel 10 displays an image through a pixel matrix in which a plurality of pixels is arranged. Each pixel implements a desired color by a combination of red, green and blue subpixels for adjusting light transmissivity by changing liquid crystal arrangement according to a data signal. Each subpixel includes a thin-film transistor (TFT) connected to a gate line GL and a data line DL, a liquid crystal capacitor Clc and storage capacitor Cst connected to the TFT in parallel. The liquid crystal capacitor Clc stores a difference voltage between a data signal supplied to a pixel electrode through the TFT and a common voltage Vcom supplied to a common electrode, drives liquid crystal according to the stored voltage, and adjusts light transmissivity. The storage capacitor Cst stably holds the voltage stored in the liquid crystal capacitor Clc. The liquid crystal layer is driven by a vertical electric field in a twisted nematic (TN) mode or a vertical alignment (VA) mode or is driven by a horizontal electric field in an in-plane switching (IPS) mode or a fringe field switching (FFS) mode.

The data driver 12 supplies image data from the timing controller 18 to the plurality of data lines DL of the display panel 10 in response to a data control signal from the timing controller 18. The data driver 12 converts digital data received from the timing controller 18 into a positive-polarity/negative-polarity analog data signal using a gamma voltage and supplies the data signal to the data lines DL whenever the gate lines GL are driven. The data driver 12 is composed of at least one data IC, is mounted in a circuit film such as a tape carrier package (TCP), a chip on film (COF) or a flexible printed circuit (FPC), and is attached to the display panel 10 using a tape automatic bonding (TAB) method or mounted on the display panel 10 using a chip on glass (COG) method.

The gate driver 14 sequentially drives the plurality of gate lines GL formed in the TFT array of the display panel 10 in response to a gate control signal from the timing controller 18. The gate driver 14 supplies a scan pulse of a gate on voltage in each scan period of each gate line GL and supplies a gate off voltage during other periods in which other gate lines GL are driven. The gate driver 14 is composed of at least one gate IC, is mounted in a circuit film such as a tape carrier package (TCP), a chip on film (COF) or a flexible printed circuit (FPC), and is attached to the display panel 10 using a tape automatic bonding (TAB) method or mounted on the display panel 10 using a chip on glass (COG) method. Alternatively, the gate driver 14 may be mounted in the display panel 100 using a gate in panel (GIP) to be formed on the TFT substrate along with the pixel array.

The timing controller 18 processes image data received from the host computer 50 and supplies the processed image data to the data driver 12. For example, in order to improve response speed of the liquid crystals, the timing controller 18 may correct the image data by overdriving the image data in which an overshoot value or an undershoot value is added to the image data depending on a data difference between adjacent frames and output the corrected data to the data driver 12.

The timing controller 18 generates a data control signal for controlling driving timing of the data driver 12 and a gate control signal for controlling driving timing of the gate driver 14 using a plurality of synchronizing signals received from the host computer 50, that is, a vertical synchronizing signal Vsync, a horizontal synchronizing signal Hsync, a data enable signal and a dot clock. The timing controller 18 outputs the generated data control signals and gate control signals to the data driver 12 and the gate driver 14, respectively. The data control signals include a source start pulse and source sampling clock for controlling latch of a data signal, a polarity control signal for controlling polarity of the data signal, a source output enable signal for controlling an output period of the data signal, etc. The gate control signals include a gate start pulse and gate shift clock for controlling scanning of a gate signal, a gate output enable for controlling an output period of the gate signal, etc. The timing controller 18 supplies the synchronizing signals (the vertical synchronizing signal Vsync, the horizontal synchronizing signal Hsync, etc.) to the touch controller 30 and controls the driving timing of the touch controller 30 such that the drive timing of the display panel 10 interlocks with the driving timing of the touch sensor 20.

The touch sensor 20 detects senses when a user contacts or touches the touch sensor 20 to enables the user to communicate with the GUI displayed on the display panel 10. In one embodiment, the touch sensor 20 is a capacitive type touch sensor that senses a change of capacitance that occurs as a small amount of charge that moves to a touch point when a conductor such as a part of a human body or a stylus touches the touch sensor 20. The touch sensor 20 may be attached to the display panel 10 or may be built in the pixel array of the display panel 10.

Referring to FIG. 2, a detailed view of a touch sensor 20 is shown. In the example illustrated in FIG. 2, the capacitive type touch sensor 20 attached to the display panel 10 includes a plurality of scan lines (or transmission lines) TX1 to TXn in which a plurality of first sensing electrodes arranged in a horizontal direction is electrically connected and a plurality of read-out lines (or reception lines) RX1 to RXm in which a plurality of second sensing electrodes 24 arranged in a vertical direction is electrically connected. Each of the first and second sensing electrodes 22 and 24 has a diamond shape but other shapes may be used in different embodiments. The first and second sensing electrodes 22 and 24 are driven by the touch controller 30 to form capacitance with a fringe field. The first and second sensing electrodes 22 and 24 form a capacitor with a conductive touch object which touches the touch sensor 20 to change the capacitance. The second sensing electrodes 24 output read-out signals indicating the capacitance change through the read-out lines RX1 to RXm to the touch controller 30.

The touch controller 30 supplies drive signals to the scan lines TX1 to TXn of the touch sensor 20. The touch controller 30 determines whether a touch is made or not for each touch node (each channel) based on the read-out signals output from the read-out lines RX1 to RXm of the touch sensor 20. The touch controller 30 calculates touch coordinates according to the result of determination and supplies the touch coordinates to the host computer 50.

The touch controller 30 converts the read-out signals received from the read-out lines RX1 to RXm into digital raw data on a channel-by-channel basis and outputs raw data of each touch node, whenever each of the scan lines TX1 to TXn of the touch sensor 20 is driven. The touch controller 30 compares the raw data of each touch node with a predetermined primary reference value so as to determine whether a touch is made or not for each touch node. If the raw data is less than the primary reference value, the touch controller 30 further compares the raw data with a secondary reference value of each touch node or each channel, which is adaptively set in consideration of external environmental conditions such as noise, so as to secondarily determine whether a touch is made or not for each touch node. The each channel is each scan line TX or each readout line RX.

The primary reference value and the secondary reference value of each touch node or each channel are predetermined by a designer according to characteristics such as design and drive conditions of the touch sensor 20 and are stored in an internal register. In addition, the secondary reference value of each touch node or each channel may be reset and updated in a step of setting the secondary reference value whenever a power supply is turned on. The secondary reference value of each touch node or each channel may be reset and updated in an additional step of setting the secondary reference value even when the touch sensor 20 has not been touched during a predetermined period or more. The secondary reference value of each touch node or each channel is set using at least one of an average value, a minimum value, a maximum value, etc. of the raw data of each touch node or each channel collected during a plurality of frames which the touch sensor 20 has not been touched. If the touch sensor 20 is touched when the secondary reference value is reset, the reset secondary reference value is discarded and whether a touch is made or not for each touch node is determined using a previously set secondary reference value, thereby preventing a secondary reference value from being erroneously set due to touch.

The host computer 50 supplies image data and a plurality of synchronizing signals to the timing controller 18. The host computer 50 analyzes touch coordinates received from the touch controller 30 to perform an order of the touch by the user.

Figure 3:
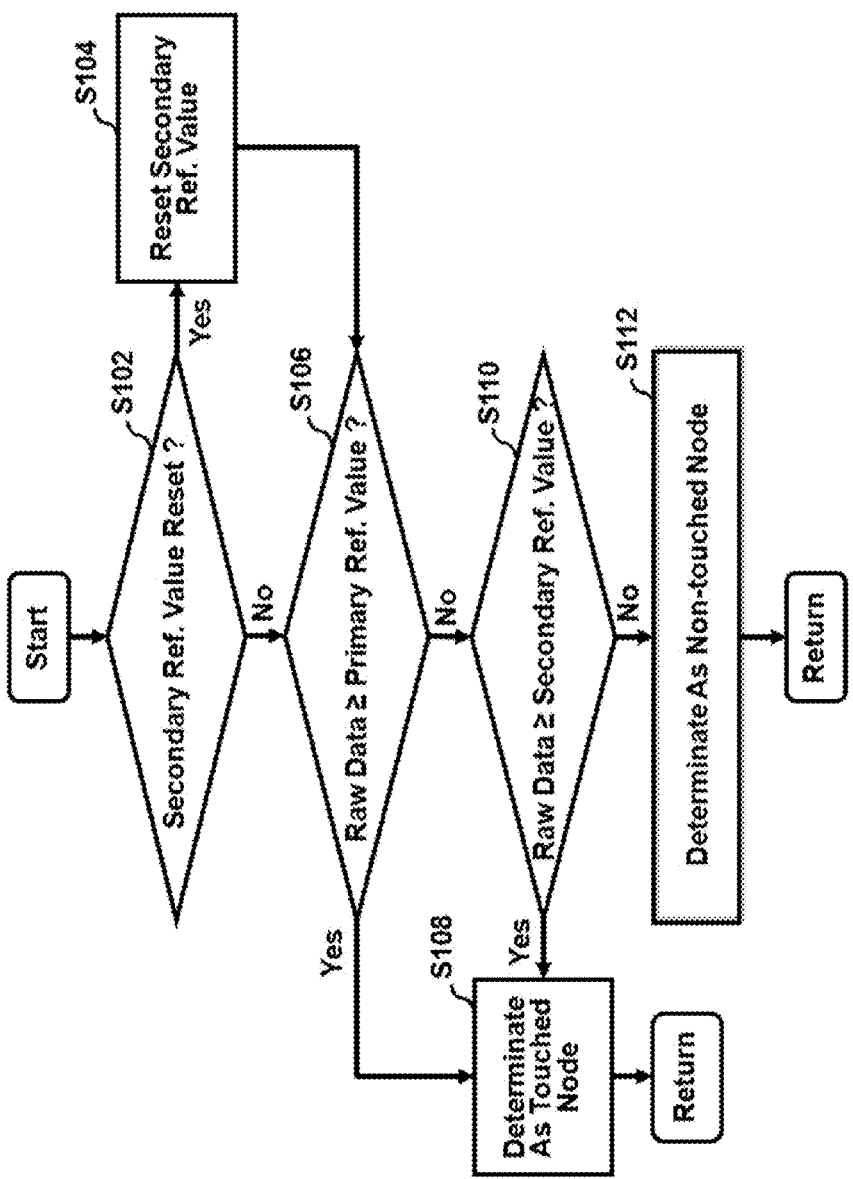
FIG. 3 is a block diagram showing a touch sensor driving apparatus according to an embodiment of the present invention.

FIG. 3 is a block diagram showing a touch sensor driving apparatus according to an embodiment of the present invention.

In FIG. 3, the touch controller 30 connected between the touch sensor 20 and the host computer 50 includes a read-out IC 32 and a microcontroller unit (MCU) 40 (i.e., a signal processor). The MCU 40 includes a touch determination unit 42, a touch coordinate calculator 44, and an interface 46.

The read-out IC 32 supplies driving signals to the scan lines TX1 to TXn of the touch sensor 20 and detects raw data of each touch node using read-out signals output from the read-out lines RX1 to RXm of the touch sensor 20.

The MCU 40 determines whether a touch is made or not for each touch node using the raw data from the read-out IC 32, calculates the touch coordinates according to the result of determination, and supplies the touch coordinates to the host computer 50. In addition, the MCU 40 frequently resets and updates the secondary reference value of each touch node or each channel.

The touch determination unit 42 compares the raw data from the read-out IC 32 with the predetermined primary reference value so as to primarily determine whether a touch is made or not for each touch node. If the raw data is greater than or equal to the primary reference value, it is determined that the corresponding touch node has been touched. If the raw data is less than the primary reference value, the raw data is compared with the secondary reference value of each touch node or each channel adaptively set in consideration of external environment conditions such as noise so as to secondarily determine whether the touch node has been touched. If the raw data is greater than or equal to secondary reference value, it is determined that the touch node is touched and, if the raw data is less than the secondary reference value, it is determined that the touch node is not touched. Thus, touch sensitivity and accuracy are improved by comparing variable raw data with the primary reference value and further comparing the raw data with the secondary reference value of each touch node or each channel in consideration of characteristics of each touch node and external environments so as to determine whether the touch node has been touched. In addition, touch sensitivity and accuracy are improved even in change in external environment, such as noise, by frequently updating a secondary reference value of each touch node or each channel.

The primary reference value and the secondary reference value of each touch node or each channel are predetermined by a designer according to characteristics such as design and drive conditions of the touch sensor 20 and are stored in the internal register (not shown) of the MCU 40. In addition, the touch determination unit 42 performs the step of setting a secondary reference value whenever a power supply is turned on so as to reset and update the secondary reference value of each touch node or each channel. In addition, the touch determination unit 42 performs an additional step of setting a secondary reference value so as to reset and update the secondary reference value of each touch node or each channel, when the touch sensor 20 has not been touched during a predetermined period or more.

The touch determination unit 42 collects the raw data of each node during a plurality of frames which the touch sensor 20 has not been touched and sets the secondary reference value of each touch node or each channel using at least one of an average value, a minimum value, a maximum value, etc. of the collected raw data. For example, the secondary reference value of each touch node or each channel may be set to a value obtained by subtracting a difference between an average value and a minimum value or a difference between an average value and a maximum value of each touch node or each channel from the primary reference value. The secondary reference value of each touch node may be set to the minimum value of the collected raw data of each touch node or each channel.

If a touch operation is detected when the secondary reference value is set, the touch determination unit 42 discards the reset secondary reference value and determines whether the touch sensor 20 has been touched using a previously set secondary reference value.

The touch coordinate calculator 44 calculates a touch coordinate value (XY coordinate value) using determined raw data that the touch node has been touched, from the touch determination unit 42 and supplies the touch coordinate value to the host computer via the interface 46. The touch coordinate calculator 44 calculates a touch coordinate value (XY coordinate) based on position information (X coordinate) of a reception line RX for outputting the raw data and position information (Y coordinate) of a scanned transmission line TX.

Figure 4:
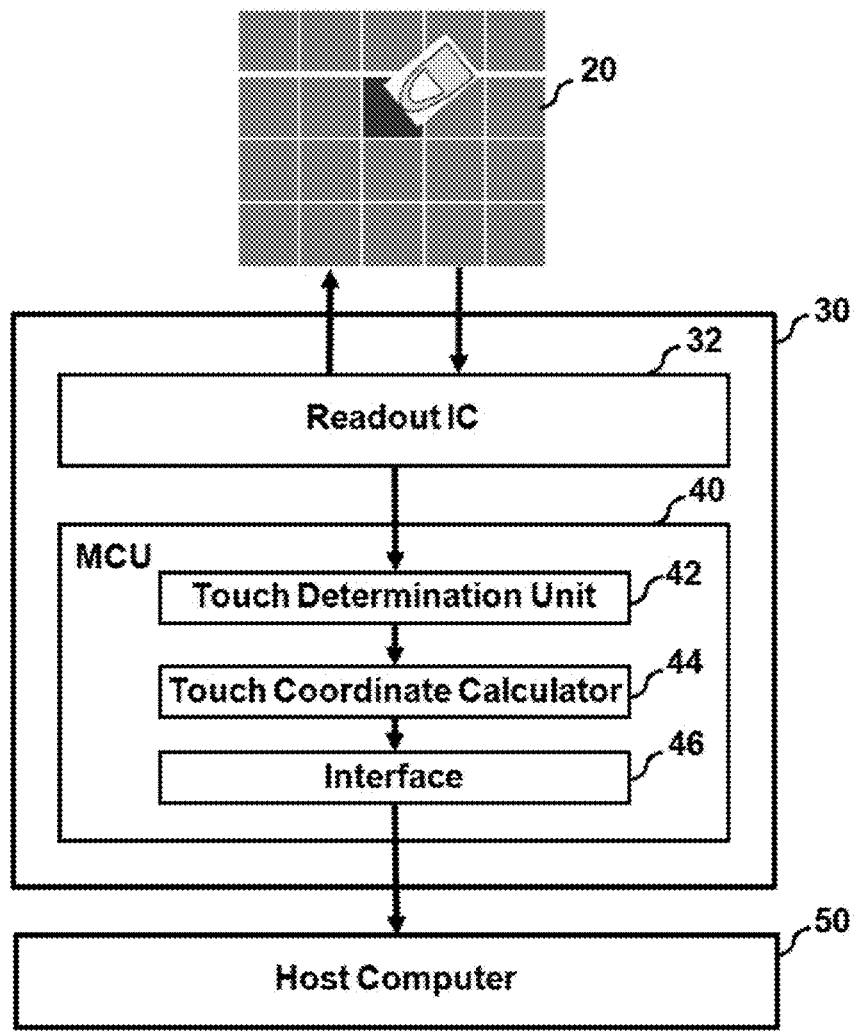
FIG. 4 is a flowchart illustrating a touch sensor driving method according to an embodiment of the present invention.

FIG. 4 is a flowchart illustrating a method of determining presence/absence of a touch operation in the touch determination unit 42 of the MCU 40 shown in FIG. 3.

First, in step 102 (S102), the touch determination unit 42 determines whether a secondary reference value is reset or not. The touch determination unit 42 determines that the secondary reference value is reset when a power supply is turned on and/or when a touch operation is not detected during a predetermined period or more and then proceed to step 104 (S104) of resetting the secondary reference value. Otherwise, the touch determination unit 42 determines that the secondary reference value is not reset and then proceed step 106 (S106) of determining whether the touch sensor 20 has been touched.

Figure 5:
FIG. 5 is a table showing an example of a method of detecting average raw data of each touch node.

In step 104 (S104), the touch determination unit 42 collects the raw data of each touch node or each channel during a plurality of frames and calculates an average value of the collected raw data as shown in FIG. 5. The touch determination unit 42 calculates a minimum value and a maximum value of each touch node or each channel from the collected raw data. The touch determination unit 42 sets the minimum value of each touch node to the secondary reference value of each touch node or each channel and updates the secondary reference value of each touch node or each channel, which is previously stored in the register. The other hand, the touch determination unit 42 calculates a difference between the average value and minimum value of each touch node (or each channel) or a difference between the average value and maximum value of each touch node (or each channel), and then subtracts the calculated difference from the primary reference value. The touch determination unit 42 sets the value obtained by subtracting the calculated difference from the primary reference value, to the secondary reference value of each touch node or each channel and updates the secondary reference value of each touch node or each channel, which is previously stored in the register, to the reset secondary reference value, And then, the touch determination unit 42 proceeds to step 106 (S106). Thus, the secondary reference value of each touch node or each channel is adaptively reset and updated in consideration of external environmental conditions such as noise.

In step 106 (S106), the touch determination unit 42 compares the raw data with the primary reference value so as to primarily determine whether the touch node has been touched. The touch determination unit 42 determines that the touch node has been touched if the raw data is equal to or greater than the primary reference value and proceeds to step 108 (S108) of outputting raw data to the touch coordinate calculator 44. In contrast, the touch determination unit 42 proceeds to step 110 (S110) if the raw data is less than the primary reference value. Alternatively, the touch determination unit 42 may compare the raw data with a base value, which is less than the primary reference value, before step 106 (S106), proceed to step 106 (S106) only if the raw data is equal to or greater than the base value, and determine that the touch node is not touched if the raw data is less than the base value.

In step 110 (S110), the touch determination unit 42 compares the raw data with the secondary reference value of each touch node or each channel so as to secondarily determine whether the touch node has been touched. The touch determination unit 42 determines that the touch node is touched and proceeds to step 108 (S108) of outputting the raw data to the touch coordinate calculator 44, if the raw data is equal to or greater than the secondary reference value. In contrast, the touch determination unit 42 proceeds to step 112 (S112) of determining that the touch node is not touched if the raw data is less than the secondary reference value.

Figure 6A:
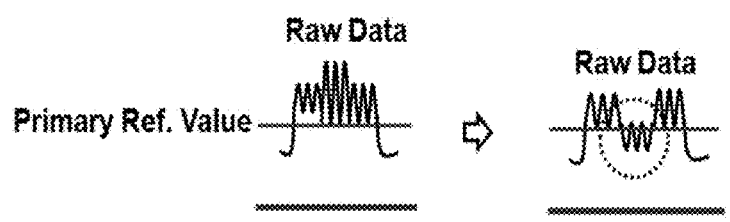
FIGS. 6a and 6b are diagrams illustrating a process of determining presence/absence of a touch operation in the related art and the present invention.
Figure 6B:
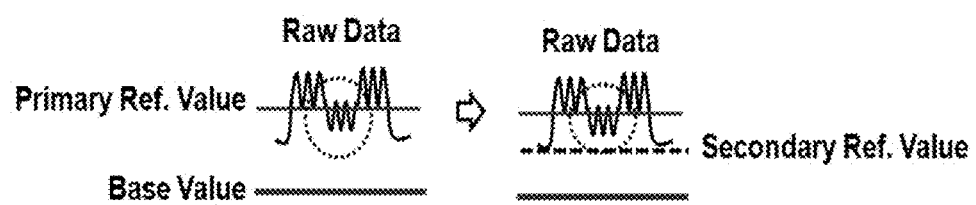

FIGS. 6a and 6b are diagrams illustrating a process of determining presence/absence of a touch operation in the related art and the present invention.

Referring to FIG. 6a, the raw data of each touch node is compared with the conventional reference value and it is determined that the touch node is touched only if the raw data is equal to or greater than the reference value. Although the touch sensor is touched, if the raw data is less than the conventional reference value due to noise of a display apparatus, it is determined that the touch node is not touched and thus the touch node cannot be detected.

Referring to FIG. 6b, the raw data of each touch node is primarily compared with the primary reference value and it is determined that the touch node is touched if the raw data is equal to or greater than the primary reference value. If the raw data is less than the primary reference value, the raw data is secondarily compared with the secondary reference value. It is determined that the touch node is touched if the raw data is equal to or greater than the secondary reference value and it is determined that the touch node is not touched if the raw data is less than the secondary reference value. Accordingly, it is possible to accurately detect a touch operation even under the influence of noise.

According to an apparatus and method for driving a touch sensor of the present invention, it is possible to improve touch sensitivity and accuracy by comparing variable raw data with a primary reference value and comparing the raw data with a secondary reference value of each touch node or each channel in consideration of characteristics of each touch node or each channel and external environments so as to determine whether a touch is made or not for each touch node. In addition, it is possible to adaptively improve touch sensitivity and accuracy even in change in external environment, such as noise, by frequently updating a secondary reference value of each touch node or each channel to be compared with the raw data.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A touch sensor apparatus in a computer, comprising:
   a touch sensor;
   a read-out circuit configured to drive the touch sensor, detect raw data of each touch node of the touch sensor using each read-out signal received from the touch sensor, and output the raw data; and
   a signal processor configured to compare the raw data from the read-out circuit with a predetermined primary reference value and secondary reference value to determine whether the touch node has been touched and calculate and output touch coordinates corresponding to the touch node which has been touched so that the computer executes a command based on the touch coordinates,
   wherein the signal processor collects the raw data of each touch node or each channel during a plurality of frames in which the touch sensor has not been touched and resets and updates the secondary reference value of each touch node or each channel using at least one of a difference between an average value and a minimum value of the collected raw data, a difference between the average value and a maximum value of the collected raw data, and the minimum value of the collected raw data.

2. The touch sensor apparatus of claim 1, wherein the signal processor includes:
   a touch determination unit configured to determine whether the touch node has been touched and reset the secondary reference value;
   a touch coordinate calculator configured to calculate the touch coordinates; and
   an interface configured to enable the output of the touch coordinates.

3. The touch sensor apparatus of claim 2, wherein the touch determination unit resets the secondary reference value if a power supply is turned on and/or if the touch sensor has not been touched during a predetermined period or more.

4. The touch sensor apparatus of claim 3, wherein the touch determination unit collects the raw data of each touch node or each channel during the plurality of frames in which the touch sensor has not been touched, calculates the average value, the minimum value and the maximum value of each touch node or each channel using the collected raw data of each touch node or each channel.

5. The touch sensor apparatus of claim 4, the secondary reference value is reset as the minimum of each touch node or each channel, or as a value obtained by subtracting the difference of each touch node or each channel from the primary reference value.

6. The touch sensor apparatus of claim 3, wherein the touch determination unit compares the raw data of each touch node with the primary reference value and determines that the corresponding touch node is touched if the raw data is equal to or greater than the primary reference value, compares the raw data of each touch node with the secondary reference value if the raw data is less than the primary reference value, determines that the corresponding touch node is touched if the raw data is equal to or greater than the secondary reference value, and determines that the corresponding touch node is not touched if the raw data is less than the secondary reference value.

7. The touch sensor apparatus of claim 6, wherein the touch determination unit compares the raw data with a base value, which is less than the primary reference value, before comparing the raw data with the primary reference value, compares the raw data with the primary reference value only if the raw data is equal to or greater than the base value, and determines that the touch node is not touched if the raw data is less than the base value.

8. The touch sensor apparatus of claim 3, wherein the touch determination unit discards the reset secondary reference value and uses a previously set secondary reference value, if the touch sensor is touched when resetting the secondary reference value.

9. A method for driving a touch sensor in a computer, the method comprising:
   detecting and outputting raw data of each touch node using each read-out signal received from the touch sensor while driving the touch sensor;
   determining whether a secondary reference value used to determine whether a touch node is touched is reset;
   collecting raw data of each touch node or each channel during a plurality of frames, wherein, when the secondary reference value is determined to be reset, the secondary reference value of each touch node is reset and updated using the collected raw data;
   comparing the raw data of each touch node with a predetermined primary reference value and determining whether the touch node is touched;
   if the raw data is less than the primary reference value, comparing the raw data of each touch node with the secondary reference value and determining whether the touch node is touched; and
   if it is determined that a touch node is touched, calculating and outputting touch coordinates corresponding to the touch node that is touched so that the computer executes a command based on the touch coordinates,
   wherein, when the secondary reference value is reset, the secondary reference value is reset as a measure of an amount of noise in the collected raw data subtracted from the primary reference value.

10. The method of claim 9, wherein the determining whether the secondary reference value is reset includes determining that the secondary reference value is reset if a power supply is turned on and/or the touch sensor is not touched during a predetermined period or more to reset the secondary reference value and, otherwise, determining that the secondary reference value is not reset.

11. The method of claim 9, wherein the resetting the secondary reference value includes collecting the raw data of each touch node or each channel during the plurality of frames in which the touch sensor is not touched, calculating at least one of an average value, a minimum value and a maximum value of each touch node or each channel using the collected raw data of each touch node, and resetting the secondary reference value using at least one of a difference between the average value and the minimum value, a difference between the average value and the maximum value, and the minimum value of each touch node or each channel.

12. The method of claim 11, the secondary reference value is reset as the minimum value of each touch node or each channel, or as a value obtained by subtracting the difference of each touch node or each channel from the primary reference value.

13. The method of claim 9, wherein the comparing the raw data of each touch node with the primary reference value includes determining that the corresponding touch node is touched if the raw data is equal to or greater than the primary reference value.

14. The method of claim 9, wherein the comparing the raw data of each touch node with the secondary reference value includes:
   determining that the corresponding touch node is touched if the raw data is equal to or greater than the secondary reference value; and
   determining that the corresponding touch node is not touched if the raw data is less than the secondary reference value.

15. The method of claim 9, further comprising:
   comparing the raw data with a base value, which is less than the primary reference value, before comparing the raw data with the primary reference value;
   proceeding the comparing the raw data with the primary reference value only if the raw data is equal to or greater than the base value; and
   determining that the touch node is not touched if the raw data is less than the base value.

16. The method of claim 9, wherein the reset secondary reference value is discarded and a previously set secondary reference value is used, if the touch node is touched when resetting the secondary reference value.

17. The method of claim 9, wherein, when the secondary reference value is determined to be reset, raw data of each touch node or each channel is collected during a plurality of frames in which the touch sensor has not been touched, and the second reference value of each touch node or each channel is reset and updated using at least one of a difference between an average value and a minimum value of the collected raw data, a difference between the average value and a maximum value of the collected raw data, and the minimum value of the collected raw data.

18. A touch sensor apparatus in a computer, comprising:
   a touch sensor;
   a read-out circuit configured to drive the touch sensor, detect raw data of each touch node of the touch sensor using each read-out signal received from the touch sensor, and output the raw data; and
   a signal processor configured to compare the raw data from the read-out circuit with a predetermined primary reference value and secondary reference value to determine whether the touch node has been touched, and calculate and output touch coordinates corresponding to the touch node if the touch node has been touched so that the computer executes a command based on the touch coordinates,
   wherein the signal processor determines whether the secondary reference value is reset, and, when the secondary reference value is determined to be reset, the signal processor collects the raw data of each touch node or each channel during a plurality of frames and updates the secondary reference value of each touch node or each channel as a measure of an amount of noise in the collected raw data subtracted from the primary reference value.

* * * * *